(12) United States Patent      (10) Patent No.:   US 12,672,290 B2

Weng et al.               (45) Date of Patent:       Jun. 30, 2026

(54) MEMORY DEVICE AND METHOD OF FABRICATING THE SAME

(71) Applicant: MACRONIX International Co., Ltd., Hsinchu (TW)

(72) Inventors: Mao-Yuan Weng, Hualien County (TW); Ting-Feng Liao, Hsin-chu (TW); Kuang-Wen Liu, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 364 days.

(21) Appl. No.: 18/472,229

(22) Filed: Sep. 22, 2023

(65) Prior Publication Data

US 2025/0107080 A1     Mar. 27, 2025

(51) Int. Cl.
     *H10B 43/27*       (2023.01)
(52) U.S. Cl.
     CPC ................................... *H10B 43/27* (2023.02)
(58) Field of Classification Search
     CPC ........ H10B 43/00–50; H10B 20/00–10; G11C 16/0466–0475; G11C 17/10–126; H01L 21/02252; H01L 21/02315; H10W 10/014–0148
     See application file for complete search history.

(56) References Cited

U.S. PATENT DOCUMENTS

| | | | |
|---|---|---|---|
| 2020/0381451 A1 | 12/2020 | Liu et al. | |
| 2021/0104544 A1* | 4/2021 | Xiao | ................... H10D 30/693 |
| 2021/0320121 A1 | 10/2021 | Wu et al. | |
| 2024/0178140 A1* | 5/2024 | Matsuno | ............... H10B 43/50 |

FOREIGN PATENT DOCUMENTS

| | | |
|---|---|---|
| TW | 201913977 | 4/2019 |
| TW | 202101254 | 1/2021 |

OTHER PUBLICATIONS

"Office Action of Taiwan Counterpart Application", issued on Jan. 23, 2024, pp. 1-5.

* cited by examiner

*Primary Examiner* — Shahed Ahmed
(74) *Attorney, Agent, or Firm* — J.C. PATENTS

(57)          ABSTRACT

A method of fabricating a memory device at least includes the following steps. A first stack structure is formed above a substrate. The first stack structure includes a plurality of first insulating layers and a plurality of first conductive layers alternately stacked. A top layer of the first stack structure includes a plurality of anti-oxidation atoms therein. A second stack structure is formed on the first stack structure. The second stack structure includes a plurality of second insulating layers and a plurality of middle layers alternately stacked. A slit trench is formed to extend from the second stack structure to a top first conductor layer of the plurality of first conductor layers. A protective layer is formed on a sidewall of the top first conductive layer exposed by the slit trench. The memory device may be a 3D NAND flash memory with high capacity and high performance.

17 Claims, 16 Drawing Sheets

MEMORY DEVICE AND METHOD OF FABRICATING THE SAME

BACKGROUND

Technical Field

The embodiment of the disclosure relates to a semiconductor device and method of fabricating the same, and in particular to a memory device and method of fabricating the same.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory. For example, there may be gaps in the gate conductive layer formed by the gate replacement process, causing electrical problems.

SUMMARY

The embodiment of the disclosure provides a memory device that gaps in the formed gate conductive layer may be prevented or reduced.

The embodiment of the disclosure provides a method of fabricating a memory device and the method at least includes the following steps. A first stack structure is formed above a substrate, wherein the first stack structure includes a plurality of first insulating layers and a plurality of first conductive layers alternately stacked, and a top layer of the first stack structure includes a plurality of anti-oxidation atoms therein. A second stack structure is formed on the first stack structure, wherein the second stack structure includes a plurality of second insulating layers and a plurality of middle layers alternately stacked. A slit trench is formed, and the slit trench extends from the second stack structure to a top first conductive layer of the plurality of first conductive layers. A protective layer is formed on a sidewall of the top first conductive layer exposed by the slit trench.

The embodiment of the disclosure provides a memory device and the memory device includes a stop structure, a stack structure and a slit. The stop structure is disposed above a substrate. The stack structure is disposed on the stop structure, wherein the stack structure includes a plurality of insulating layers and a plurality of conductive layers alternately stacked. The slit extends through the stack structure and a portion of the stop structure. The stop structure includes a top layer, and the top layer includes a plurality of anti-oxidation atoms therein.

Based on the above, in the embodiment of the disclosure, the anti-oxidation atoms are formed at the surface of the first stack structure, and thus the oxidation of the conductive layer of the first stack structure may be reduced or prevented. Accordingly, the width of the horizontal trench formed during the gate replacement process is prevented from being too narrow, and the gate conductive layer may successfully fill into the horizontal trench. Therefore, gaps in the formed gate conductive layer may be prevented or reduced.

DESCRIPTION OF THE EMBODIMENTS

FIG. 1A to FIG. 1L are schematic cross-sectional views showing a method of fabricating a three-dimensional memory device according to some embodiments of the disclosure.

Figure 1A:
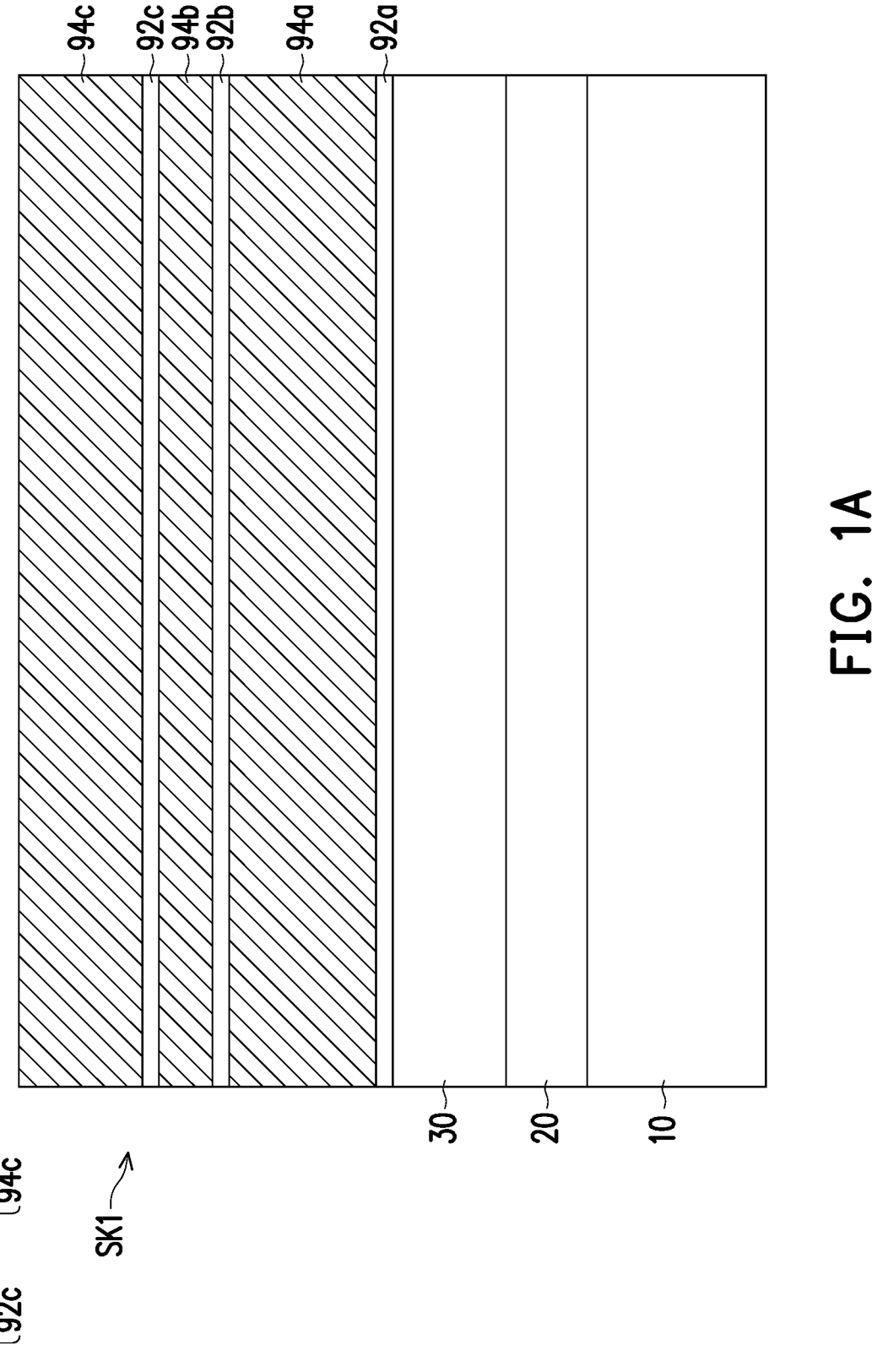
FIG. 1A to FIG. 1L are schematic cross-sectional views showing a method of fabricating a three-dimensional memory device according to some embodiments of the disclosure.

Referring to FIG. 1A, a substrate 10 is provided. The substrate 10 may be a semiconductor substrate, such as a silicon-containing substrate. A device layer 20 is formed on the substrate 10. The device layer 20 may include an active device or a passive device. The active device is, for example, a transistor, a diode and so on. The passive device is, for example, a capacitor, an inductor and so on. The transistor may be an N-type metal-oxide-semiconductor (NMOS) transistor, a P-type metal-oxide-semiconductor (PMOS) transistor, or a complementary metal-oxide-semiconductor (CMOS).

A metal interconnect structure 30 is formed on the device layer 20. The metal interconnect structure 30 may include a plurality of dielectric layers, a plurality of plugs, a plurality of conductive lines and so on. The dielectric layer separates adjacent conductive lines. The conductive lines may be connected to each other through the plug, and the conductive lines may be connected to the device layer 20 through the plugs.

A stack structure SK1 is formed on the metal interconnect structure 30. The stack structure SK1 includes a plurality of insulating layers 92 and a plurality of conductive layers 94 alternately stacked. In FIG. 1A, the stack structure SK1 includes insulating layers 92a, 92b, 92c and conductive layers 94a, 94b, 94c. In an embodiment, the material of the insulating layer 92 includes silicon oxide, and the material of the conductive layer 94 includes doped polysilicon. The numbers of the insulating layers 92 and the conductive layers 94 are not limited to those shown in the figures. Since a memory array will be formed above the stack structure SK1, and the device layer 20 is, for example, a complementary metal-oxide-semiconductor (CMOS) formed below the memory array, this architecture may also be referred to as a CMOS-Under-Array (CUA) structure. For simplicity, some layers below the conductive layer 94a are omitted in FIG. 1B to FIG. 1L.

Figure 1B:
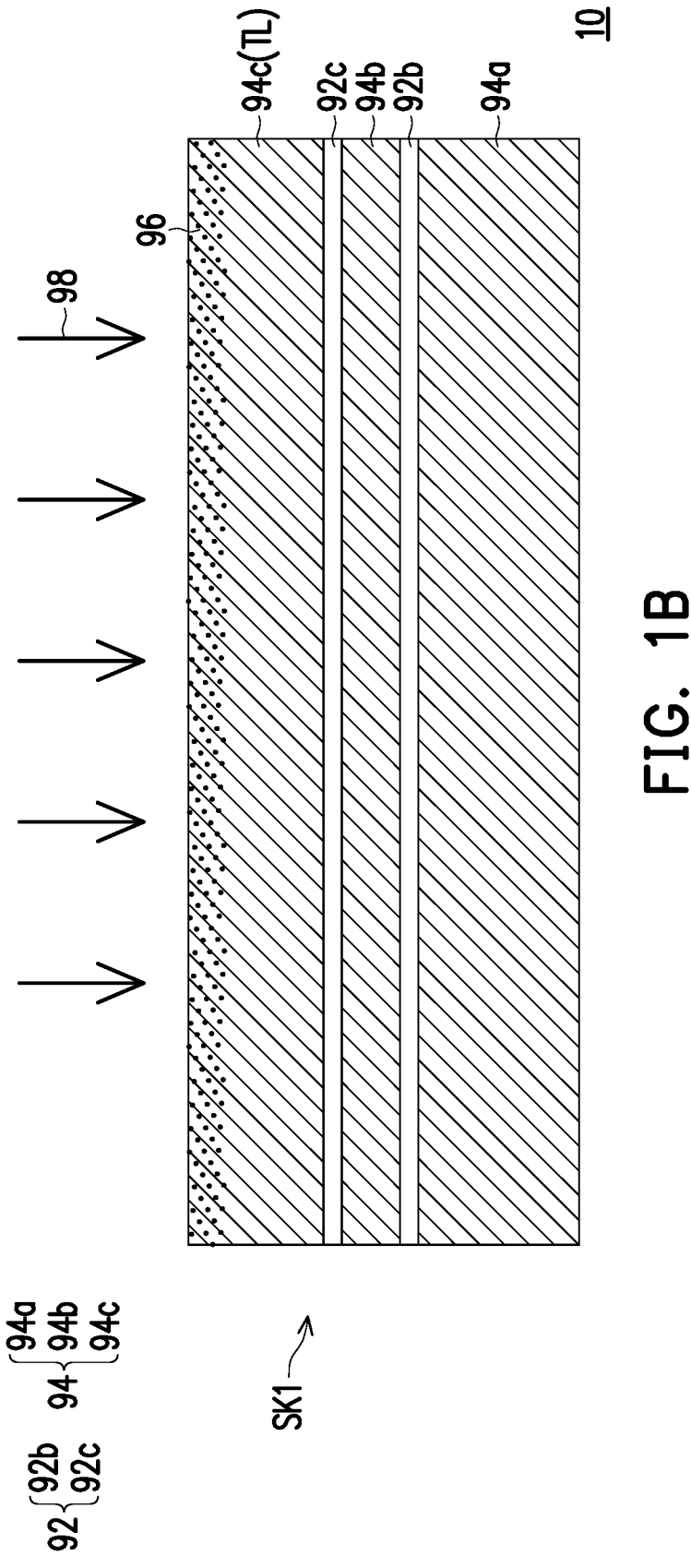

Referring to FIG. 1B, the stack structure SK1 of the embodiment of the disclosure includes a top layer TL. The top layer TL includes a plurality of anti-oxidation atoms 96 therein. The anti-oxidation atoms 96 includes inert atoms, such as nitrogen atoms. In some embodiments, the top layer TL is the conductive layer 94c. The anti-oxidation atoms 96 may be formed by performing a surface treatment process 98 on a surface of the conductive layer 94c. The surface treatment process 98 includes a plasma treatment process. A gas used in the plasma treatment process includes ammonia, nitrogen or a combination thereof.

Figure 1C:
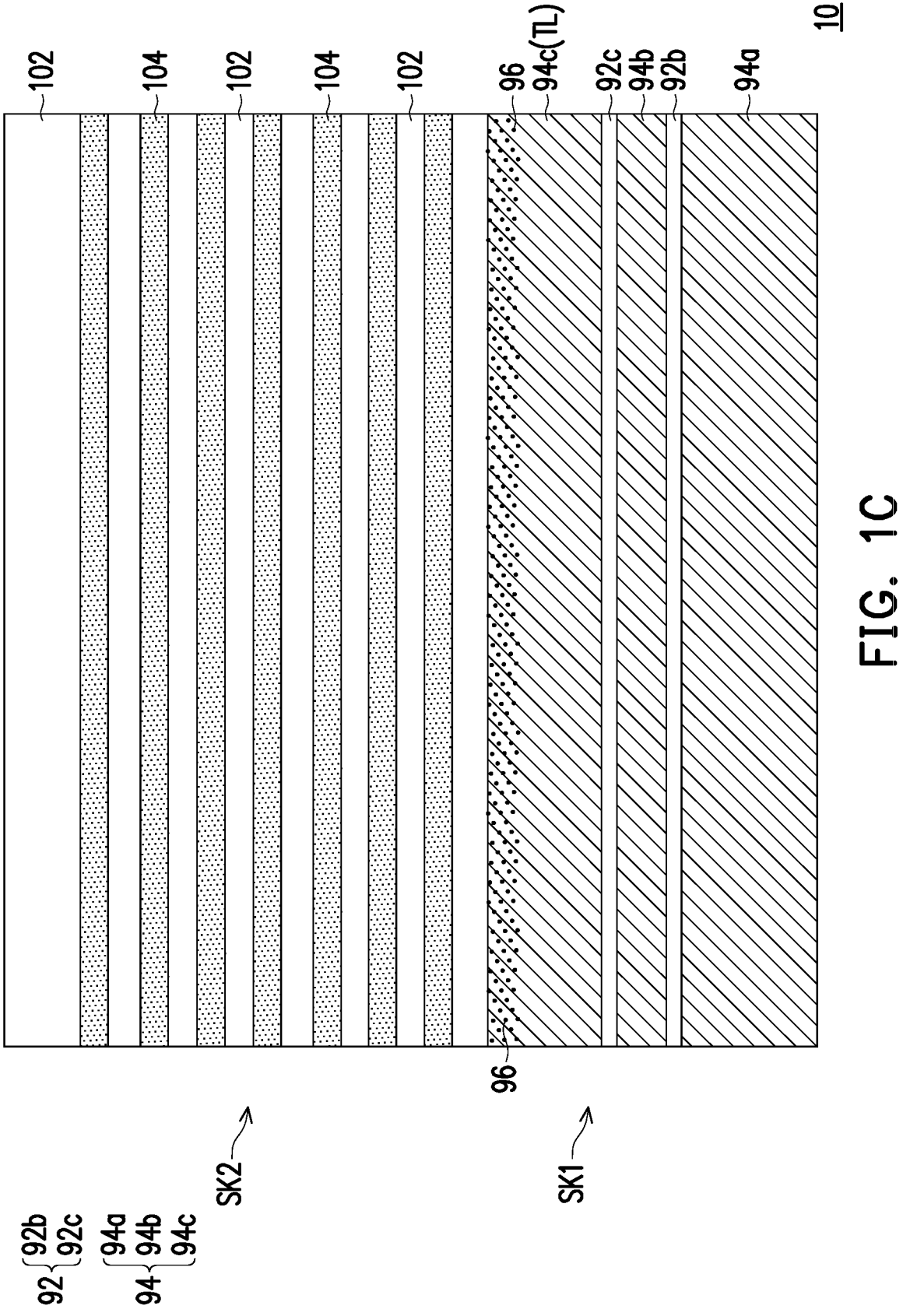

Referring to FIG. 1C, next, a stack structure SK2 is formed on the substrate 10. The stack structure SK2 includes a plurality of insulating layers 102 and a plurality of middle layers 104 alternately stacked. In an embodiment, the material of the insulating layer 102 includes silicon oxide, and the material of the middle layer 104 includes silicon nitride. The middle layers 104 may serve as sacrificial layers and may be partially removed or completely removed in the subsequent processes.

Figure 1D:
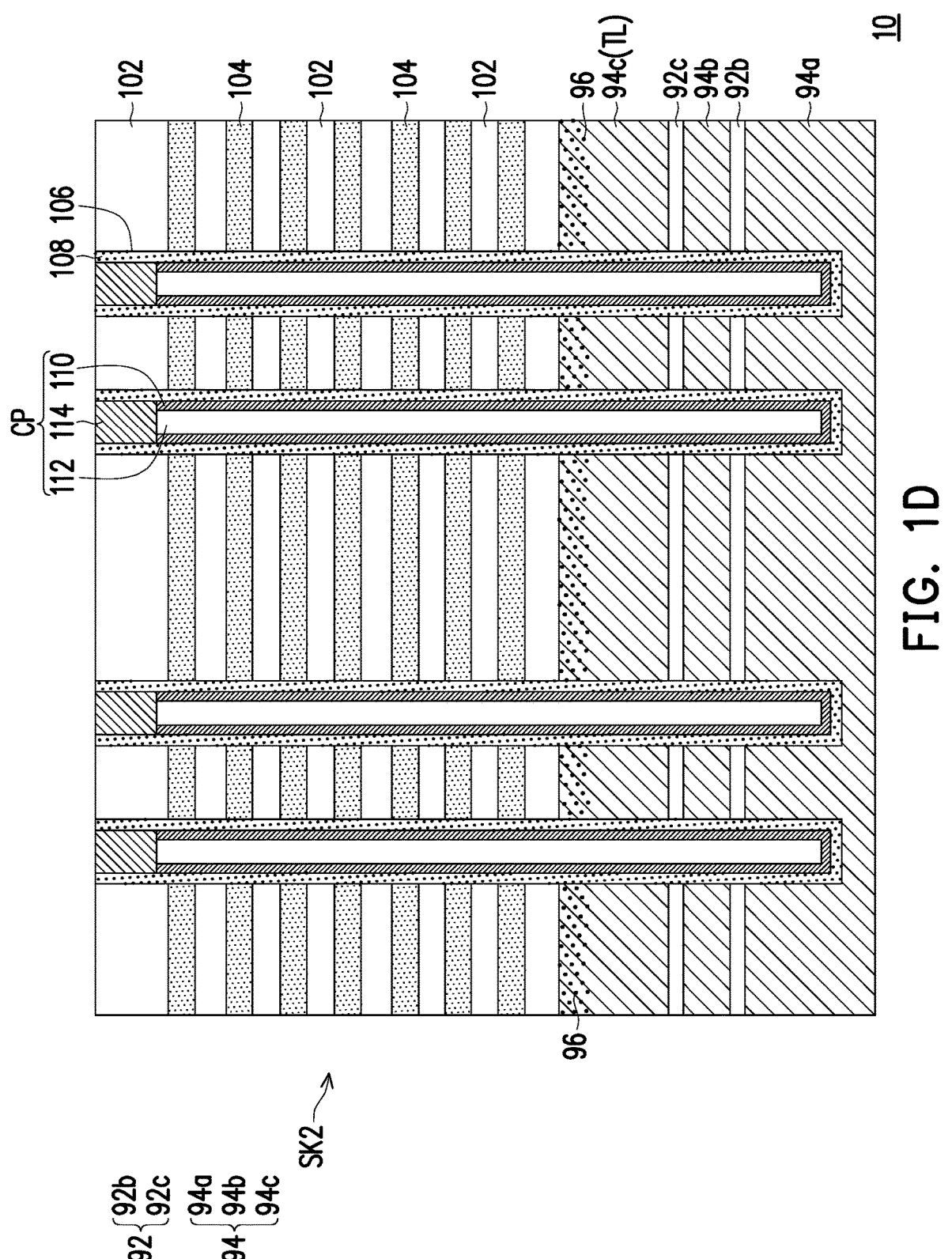
Figure 1E:
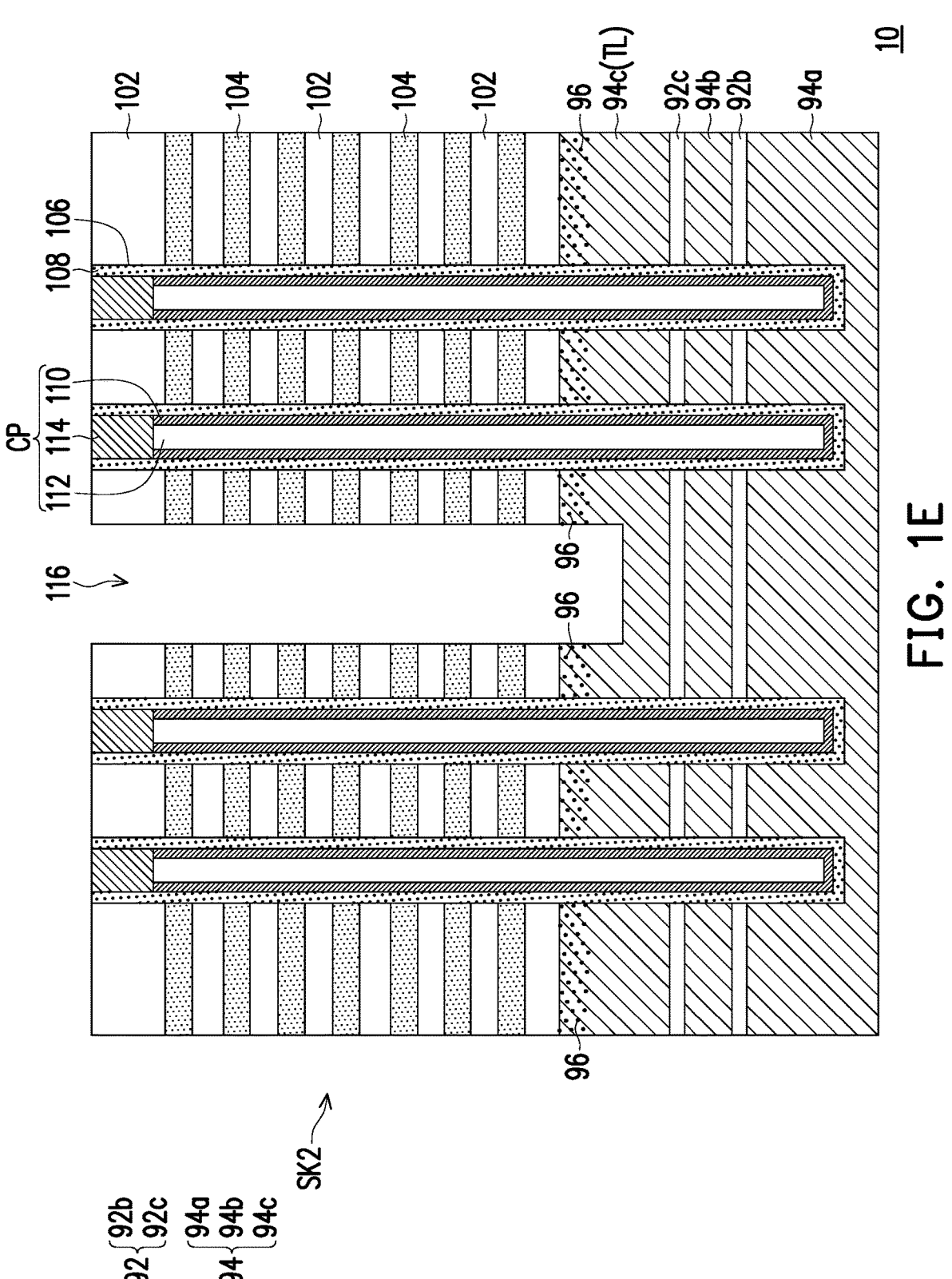

Referring to FIG. 1D, the middle layers 104 and the insulating layers 102 of the stack structure SK2 are patterned to form a staircase structure (not shown). In some embodiments, the staircase structure (not shown) may be formed through a multi-stage patterning process, but the disclosure is not limited thereto. The patterning process may include processes such as lithography, etching, and trimming. Then, a dielectric layer (not shown) is formed over the substrate 10, to cover the staircase structure.

Referring to FIG. 1D, a patterning process is performed to remove a portion of the stack structure SK2 and a portion of the stack structure SK1, to form one or more openings 106 passing through the stack structure SK2 and the stack structure SK1. In an embodiment, the opening 106 may have a substantially vertical sidewall, as shown in FIG. 1D. The opening 106 is also referred to as a vertical channel (VC) opening. In another embodiment, the opening 106 may have a slightly inclined sidewall (not shown). In an embodiment, the opening 106 may be formed through one-stage lithography and etching processes. In another embodiment, the opening 106 may be formed through multi-stage lithography and etching processes. The contour of the sidewall of the opening 106 formed through multi-stage lithography and etching processes may be in a segmental shape, for example. Next, a vertical channel pillar CP is formed in the opening 106. The vertical channel pillar CP may be formed by a method described below.

First, referring to FIG. 1D again, a charge storage structure 108 is formed on the sidewall of the opening 106. The charge storage structure 108 is in contact with the insulating layers 102, the middle layers 104, the conductive layers 94 and the insulating layers 92. In an embodiment, the charge storage structure 108 is an oxide/nitride/oxide (ONO) composite layer. In some embodiments, the charge storage structure 108 may be formed in a U shape on the sidewall and a bottom surface of the opening 106. In another embodiment, the charge storage structure 108 is formed on the sidewall of the opening 106 in the form of a spacer and exposes the bottom surface of the opening 106 (not shown).

Next, referring to FIG. 1D again, a channel layer 110 is formed on the charge storage structure 108. In an embodiment, the material of the channel layer 110 includes polysilicon. In an embodiment, the channel layer 110 covers the charge storage structure 108 on the sidewall of the opening 106 and also covers the charge storage structure 108 on the bottom surface of the opening 106. Next, an insulating pillar 112 is formed at the bottom portion of the opening 106. In an embodiment, the material of the insulating pillar 112 includes silicon oxide. Afterwards, a conductive plug 114 is formed at the top portion of the opening 106, and the conductive plug 114 is in contact with the channel layer 110. In an embodiment, the material of the conductive plug 114 includes polysilicon. The channel layer 110, the insulating pillar 112, and the conductive plug 114 may be collectively referred to as a vertical channel pillar CP. The charge storage structure 108 surrounds the vertical outer surface of the vertical channel pillar CP.

Referring to FIG. 1E again, a patterning process is performed on the stack structure SK2. The patterning process includes a first stage etching process. The first stage etching process forms a plurality of trenches 116. The trench 116 passes through the stack structure SK2 and extends into the conductive layer 94c of the stack structure SK1. The trench 116 exposes the middle layers 104, the insulating layers 102 and the conductive layer 94c.

Figure 1F:
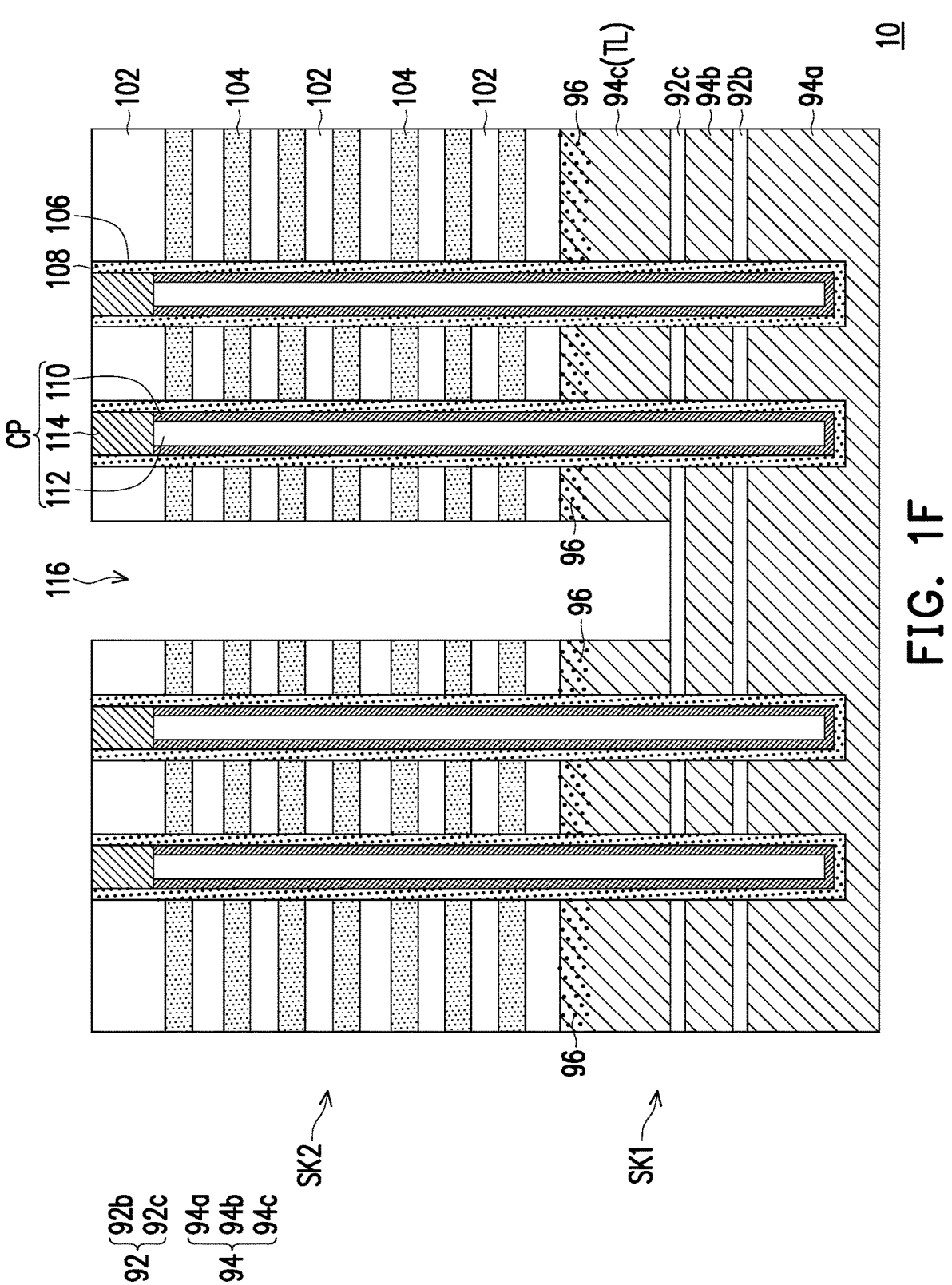

Referring to FIG. 1F, by using the insulating layer 92c as a stop layer, a second stage etching process is performed, so that the trench 116 extends downward, and the insulating layer 92c is exposed.

Figure 1G:
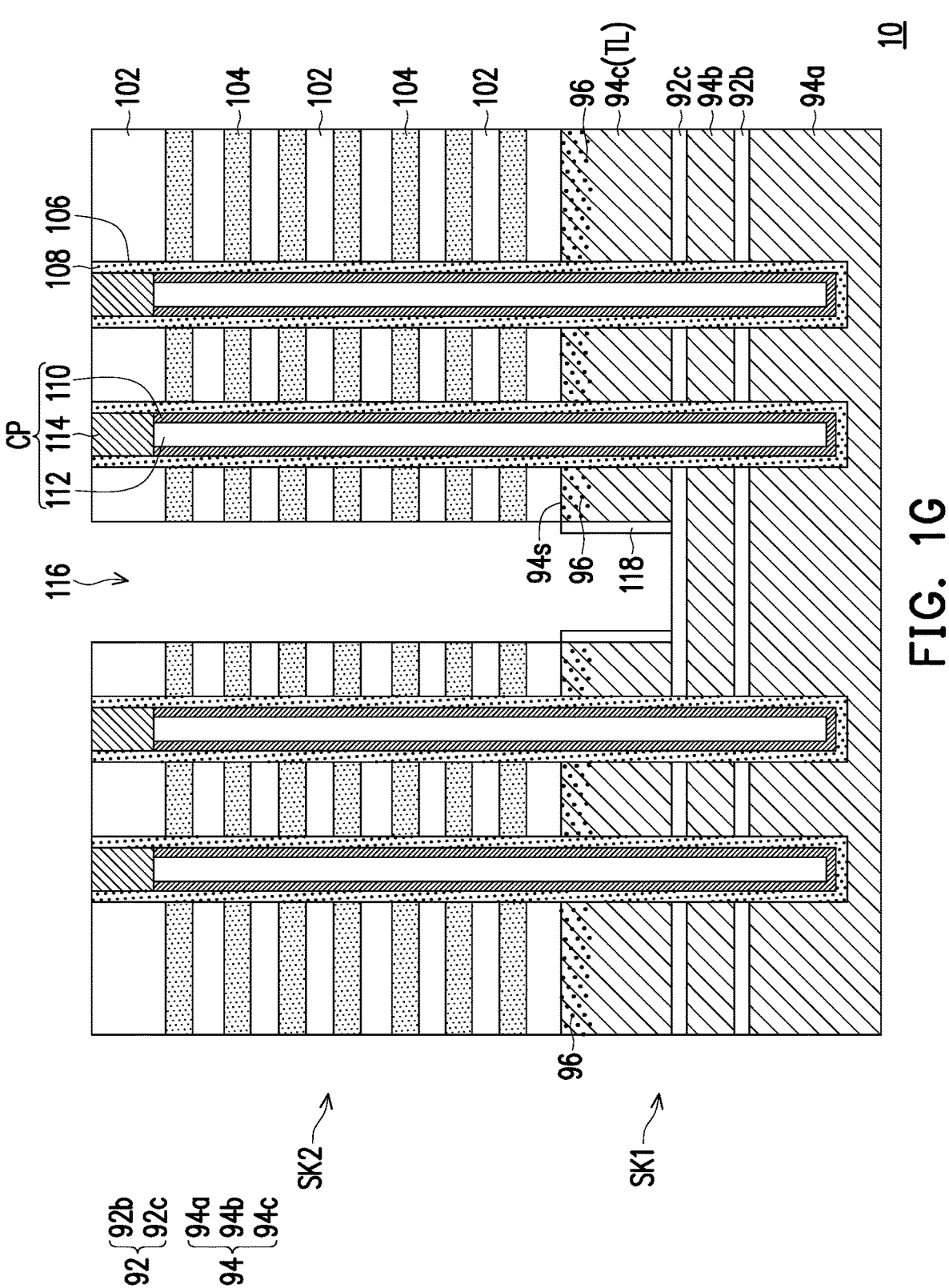

Referring to FIG. 1G, a protective layer 118 is formed on the sidewall of the conductive layer 94c exposed by the trench 116. The material of the protective layer 118 includes silicon oxide. The protective layer 118 may be formed through a thermal oxidation process. During the thermal oxidation process, since the top layer TL includes the anti-oxidation atoms 96 therein, it may inhibit the diffusion of oxygen in the thermal oxidation process into the conductive layer 94c, especially inhibit the reaction between the oxygen and the surface 94s of the conductive layer 94c which contacts the bottom surface of the stack structure SK2. Therefore, the anti-oxidation atoms 96 of the embodiment of the disclosure may prevent the surface 94s of the conductive layer 94c from being oxidized, and thus further prevent the conductive layer 94c from pressing the stack structure SK2 upward due to the oxidation. Accordingly, the bottommost one or ones of the middle layers 104 are prevented from being squeezed and deformed.

Figure 1H:
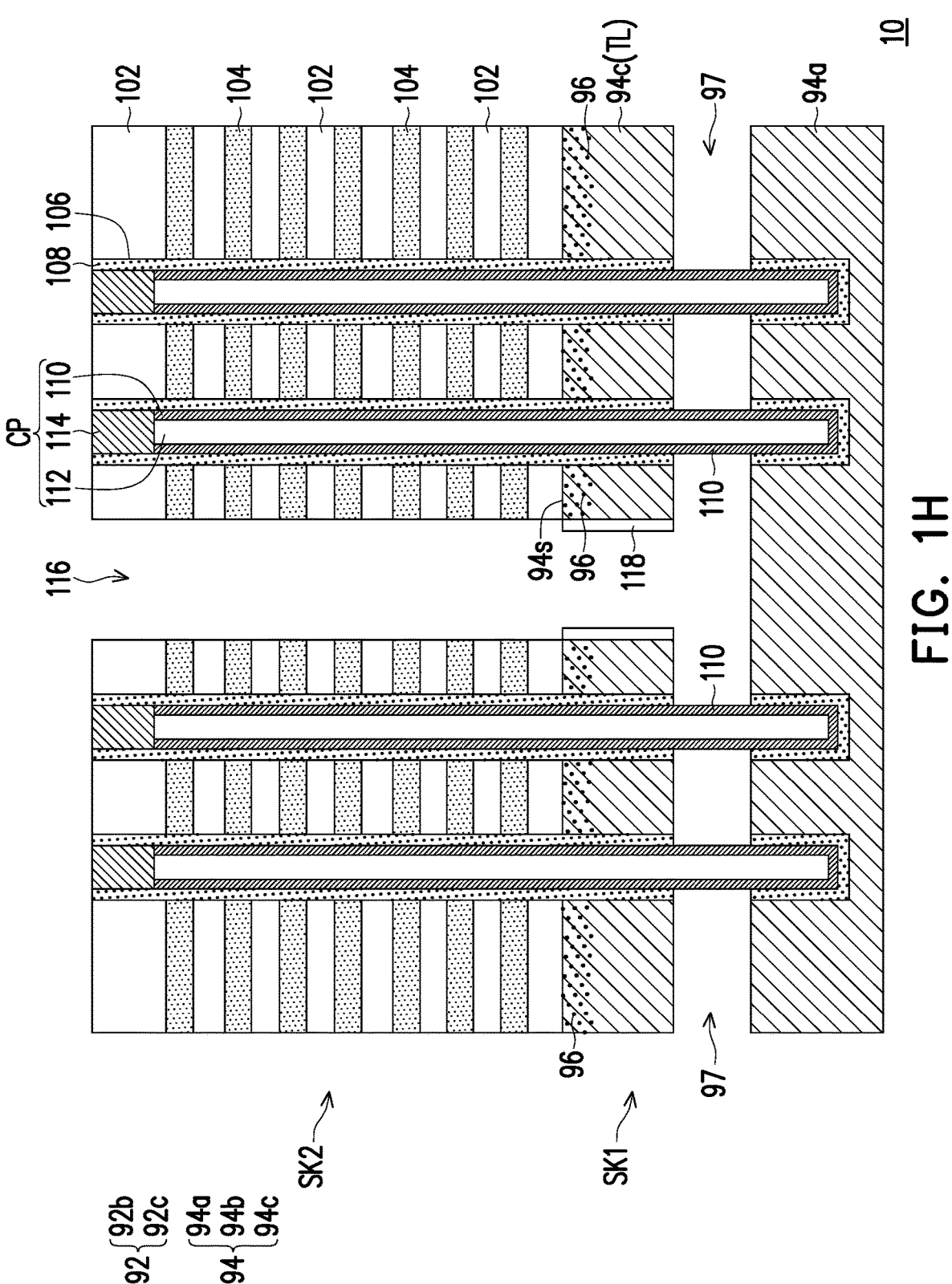

Referring to FIG. 1H, afterward, an etching process is performed to remove the insulating layer 92c, the conductive layer 94b, the insulating layer 92b and a portion of the charge storage structure 108, to form a horizontal opening 97. The horizontal opening 97 exposes the channel layer 110. During the etching, the protective layer 118 may protect the conductive layer 94c from being damaged by the etching.

Figure 1I:
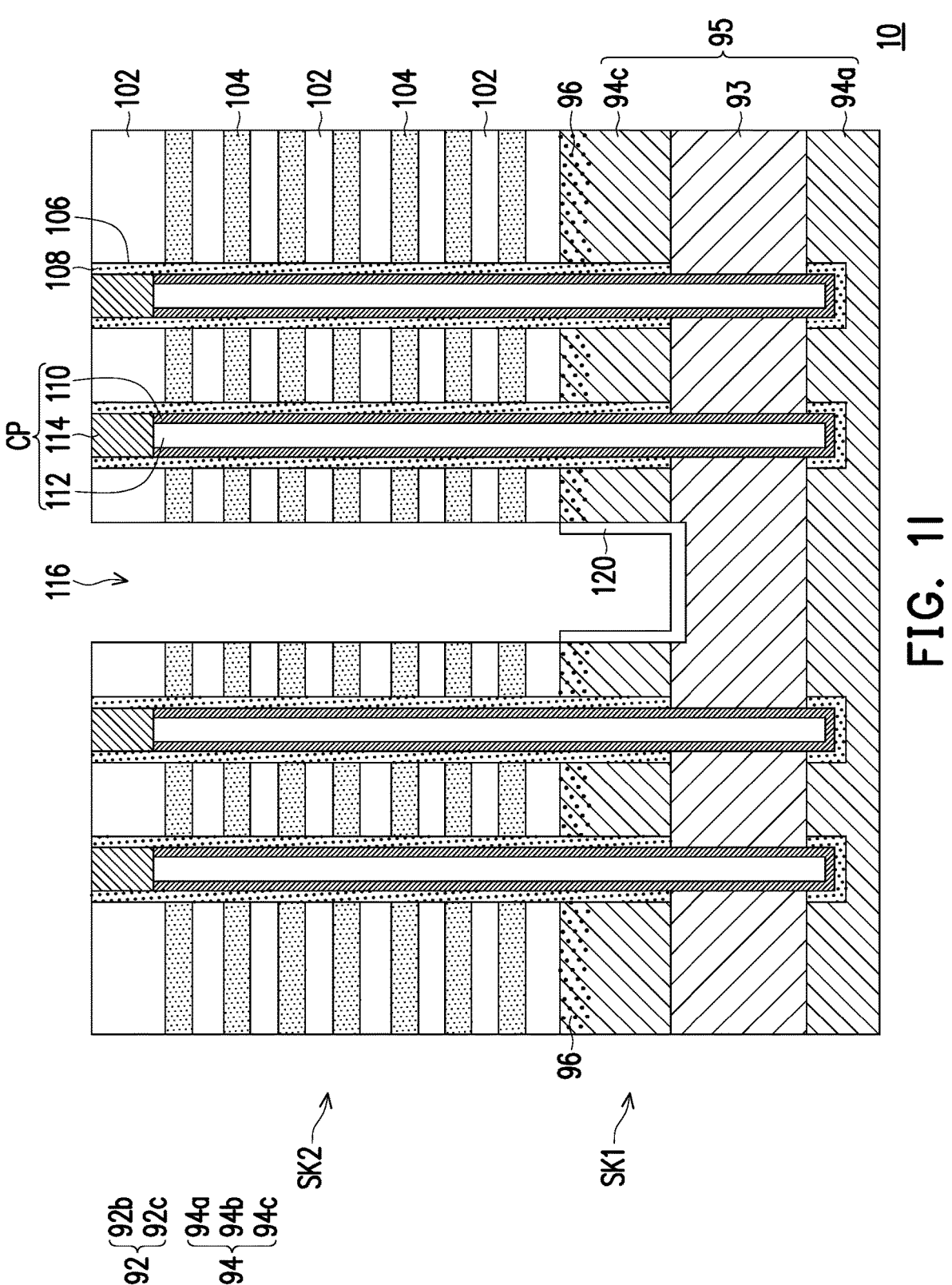

Referring to FIG. 1I, a conductive layer 93 is formed in the horizontal opening 97. The conductive layer 93 includes a semiconductor layer, such as a polysilicon layer or a doped polysilicon layer. The conductive layer 93 and the conductive layers 94a and 94c together form a source line 95. The source line 95 may also be referred to as a common source conductive layer 95. In some embodiments, the conductive layer 93 and the conductive layers 94a and 94c may also be referred to as a stop structure 95.

After that, a protective layer 120 is formed in the trench 116 to cover the sidewall of the conductive layer 94c and the surface of the conductive layer 93. The protective layer 118 may be removed or left as a portion of the protective layer 120. The material of the protective layer 120 is different from the conductive layers 94c, 93 and the middle layer 104. The material of the protective layer 120 includes silicon oxide. The protective layer 120 may be formed through a thermal oxidation process. Similarly, during the thermal oxidation process, since the top layer TL includes the anti-oxidation atoms 96 therein, it may inhibit the diffusion of oxygen in the thermal oxidation process into the conductive layer 94c, especially inhibit the reaction between the oxygen and the surface 94s of the conductive layer 94c which contacts the bottom surface of the stack structure SK2. Accordingly, the bottommost one or ones of the middle layers 104 are prevented from being squeezed and deformed.

Figure 1J:
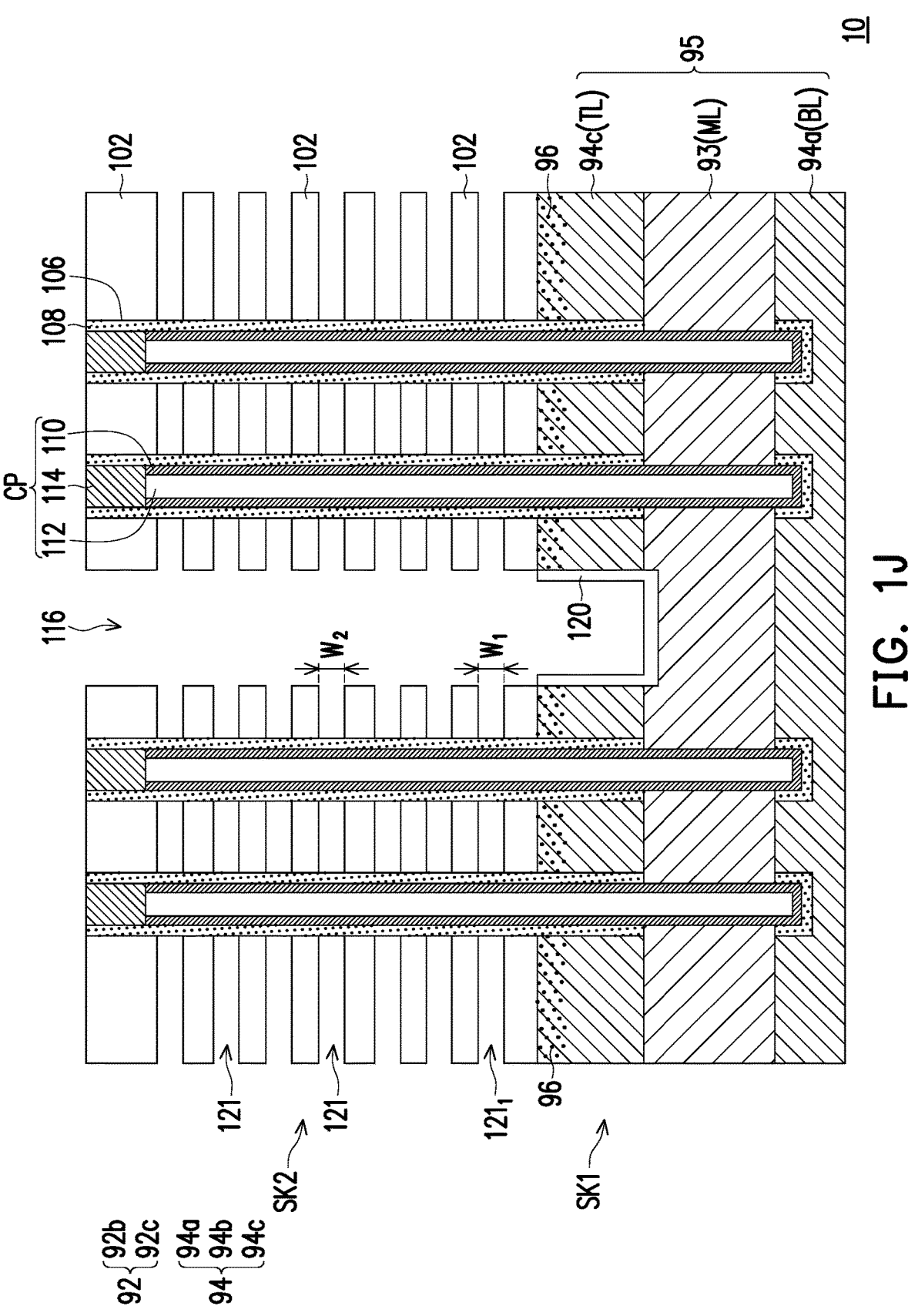
Figure 1K:
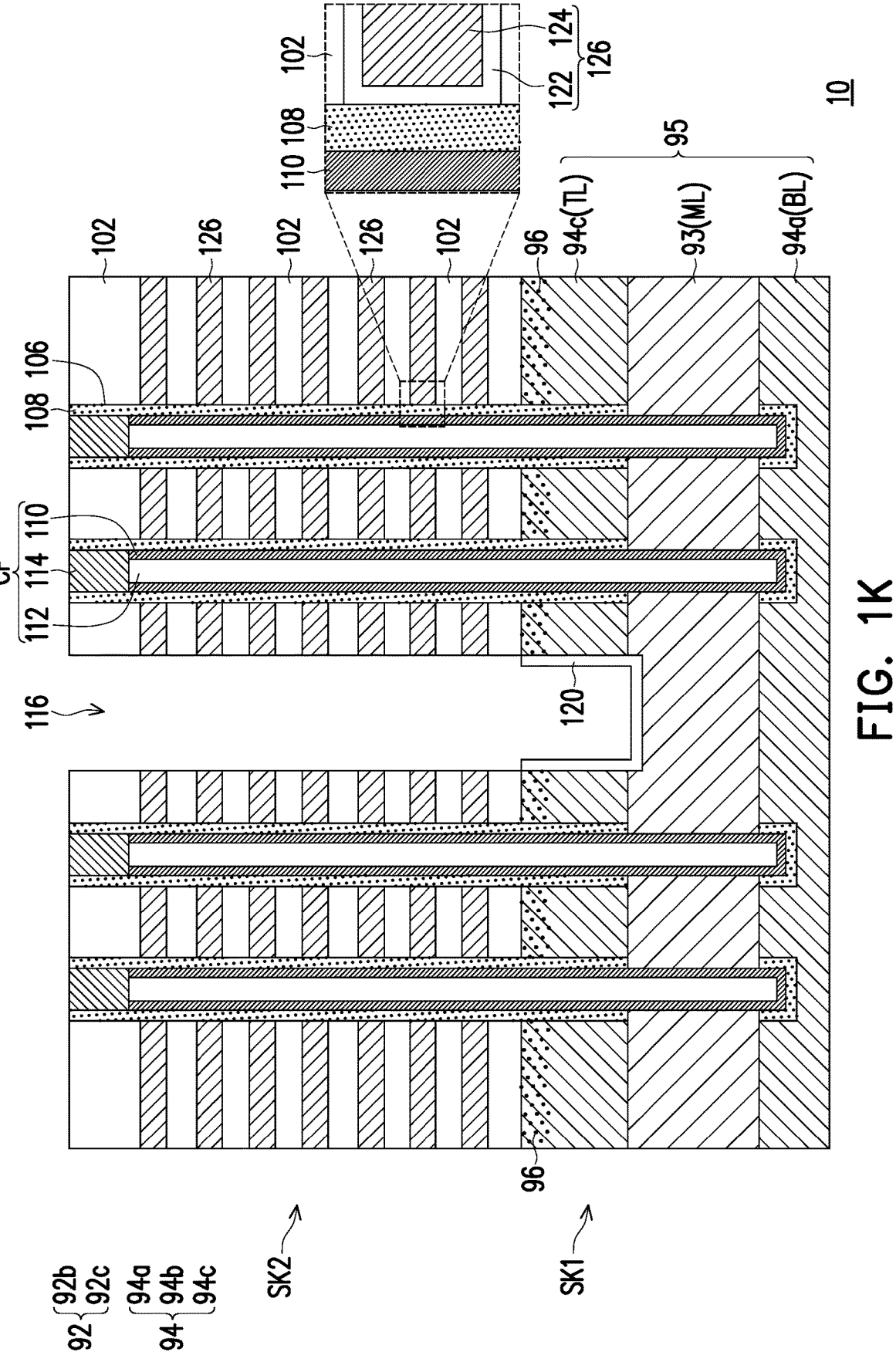

Referring to FIG. 1I to FIG. 1K, the middle layers 104 are replaced with conductive layers 126. First, a selective etching process is performed, so that an etchant contacts two sides of the stack structure SK2 through the trench 116. Accordingly, the middle layers 104 are removed to form a plurality of horizontal openings 121, as shown in FIG. 1J. The horizontal openings 121 expose portions of the charge storage structure 108, and the top and bottom surfaces of the insulating layer 102. The selective etching process may be isotropic etching such as a wet etching process. The etchant used in the wet etching process is, for example, a hot phosphoric acid.

Referring to FIG. 1K, then, a conductive layer 126 is formed in the trench 116 and the horizontal opening 121. The conductive layer 126 may serve as a gate layer or a word line (WL). The conductive layer 126 includes, for example, a barrier layer 122 and a metal layer 124. In an embodiment, the material of the barrier layer 122 includes titanium (Ti), titanium nitride (TiN), tantalum (Ta), tantalum nitride (TaN), or a combination thereof, and the material of the metal layer 124 includes tungsten (W). Since the bottommost one or ones of the middle layers 104 are not squeezed and deformed, the horizontal opening 1211 formed after removing the middle layers 104 has a sufficient width W1, which is equal or close to the width W2 of the horizontal opening 121 formed at other location. Therefore, the conductive layer 126 may successfully fill into each horizontal opening 121, especially, successfully fill into the bottommost opening 1211 or openings 1211 without gaps.

Figure 1L:
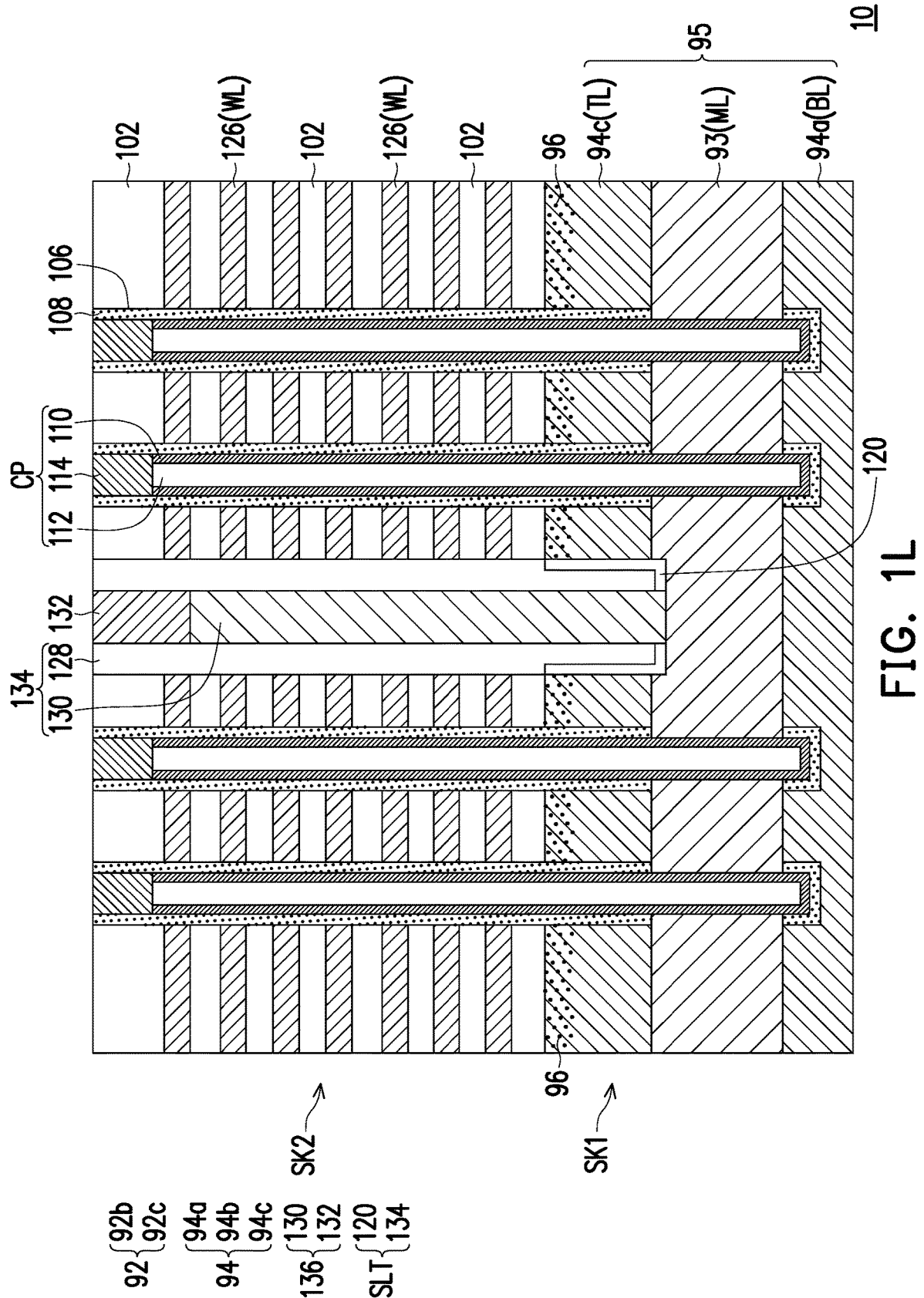

Referring to FIG. 1L, then, a filling layer 134 is formed in the trench 116. The protective layer 120 is disposed between the filling layer 134 and the stop structure 95. The filling layer 134 may include a liner layer 128, a conductive layer 130 and a conductive pad 132. The liner layer 128 is, for example, silicon oxide. The conductive layer 130 includes semiconductor material, such as polysilicon. The conductive pad 132 is, for example, tungsten. The conductive pad 132 and the conductive layer 130 together form a source line slit 136 for conducting current from the source line 95. The liner layer 128 isolates the source line slit 136 from contacting the conductive layer 126. The filling layer 134 and the protective layer 120 form a slit SLT. The slit SLT extends from the stack structure SK1 to a portion of the stop structure 95.

Afterwards, subsequent fabrication processes are performed to complete the fabrication of the memory device.

Referring to FIG. 1L, in the embodiment, the stop structure 95 includes a bottom layer BL, a middle layer ML and a top layer TL. The middle layer ML is disposed below the top layer TL and the slit SLT, and is electrically connected to the conductive layer 130 of the slit SLT. The bottom layer BL is disposed below the middle layer ML. The bottom layer BL, the middle layer ML and the top layer TL are respectively the conductive layers 94a, 93 and 94c. The conductive layers 94a, 93, 94c may be semiconductor layers, such as polysilicon layers or doped polysilicon layers. The conductive layer 94c includes the anti-oxidation atoms 96 therein. The anti-oxidation atoms are different from constituent elements of the protective layer 120 of the slit SLT. The anti-oxidation atoms may include nitrogen atoms. The concentration of the nitrogen atoms may range from 15 atomic % to 25 atomic %. The distribution range of the anti-oxidation atoms 96 may be higher than the bottom surface of the slit SLT. The anti-oxidation atoms 96 may be distributed in the top portion of the conductive layer (e.g., semiconductor layer) 94c. In other words, the concentration of the anti-oxidation atoms 96 in the top portion of the conductive layer (e.g., semiconductor layer) 94c is higher than that in the bottom portion of the conductive layer (e.g., semiconductor layer) 94c, and higher than that in the conductive layer 93 and the conductive layer 94a. In some embodiments, the conductive layer 93 and the conductive layer 94a do not have the anti-oxidation atoms 96.

FIG. 2A to FIG. 2D are schematic cross-sectional views showing a method of fabricating another three-dimensional memory device according to another embodiment of the disclosure.

Figure 2A:
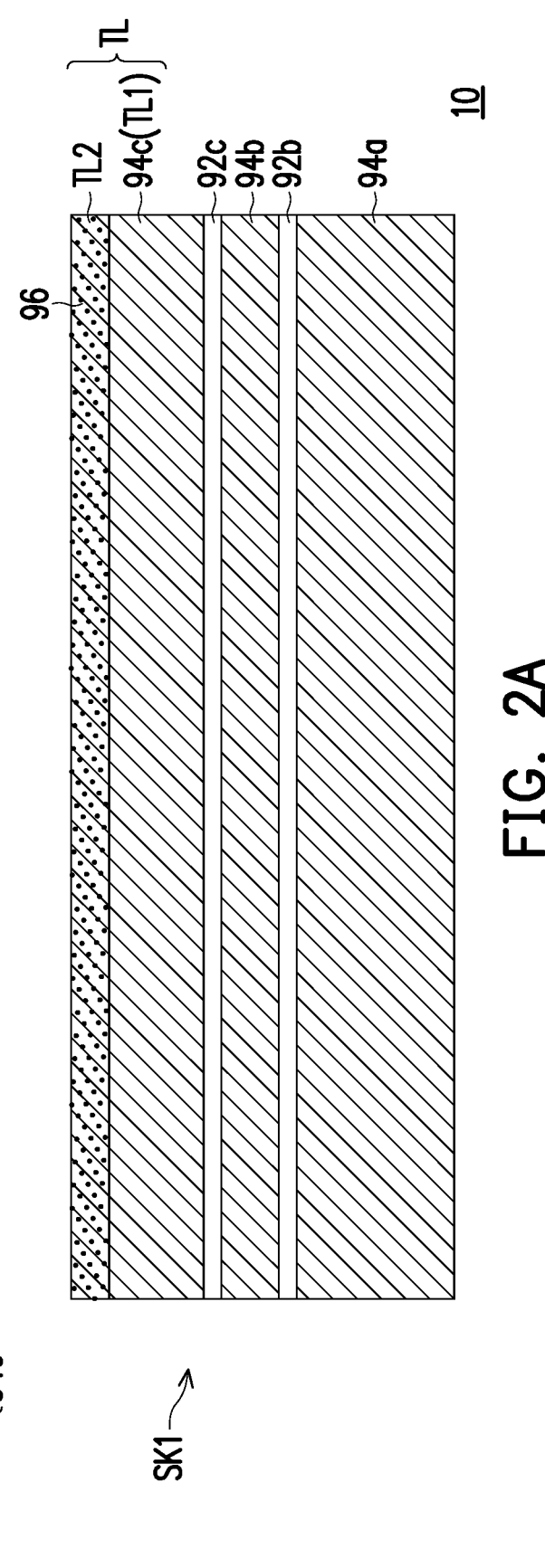
FIG. 2A to FIG. 2D are schematic cross-sectional views showing a method of fabricating another three-dimensional memory device according to another embodiment of the disclosure.

Referring to FIG. 2A, a top layer TL includes top layer TL1 and TL2. The top layer TL1 is a conductive layer 94c, and the top layer TL2 is a barrier layer such as a silicon nitride layer. A silicon nitride layer is formed above the conductive layer 94c. The silicon nitride layer may be formed by chemical vapor deposition after the conductive layer 94c is formed.

Figure 2B:
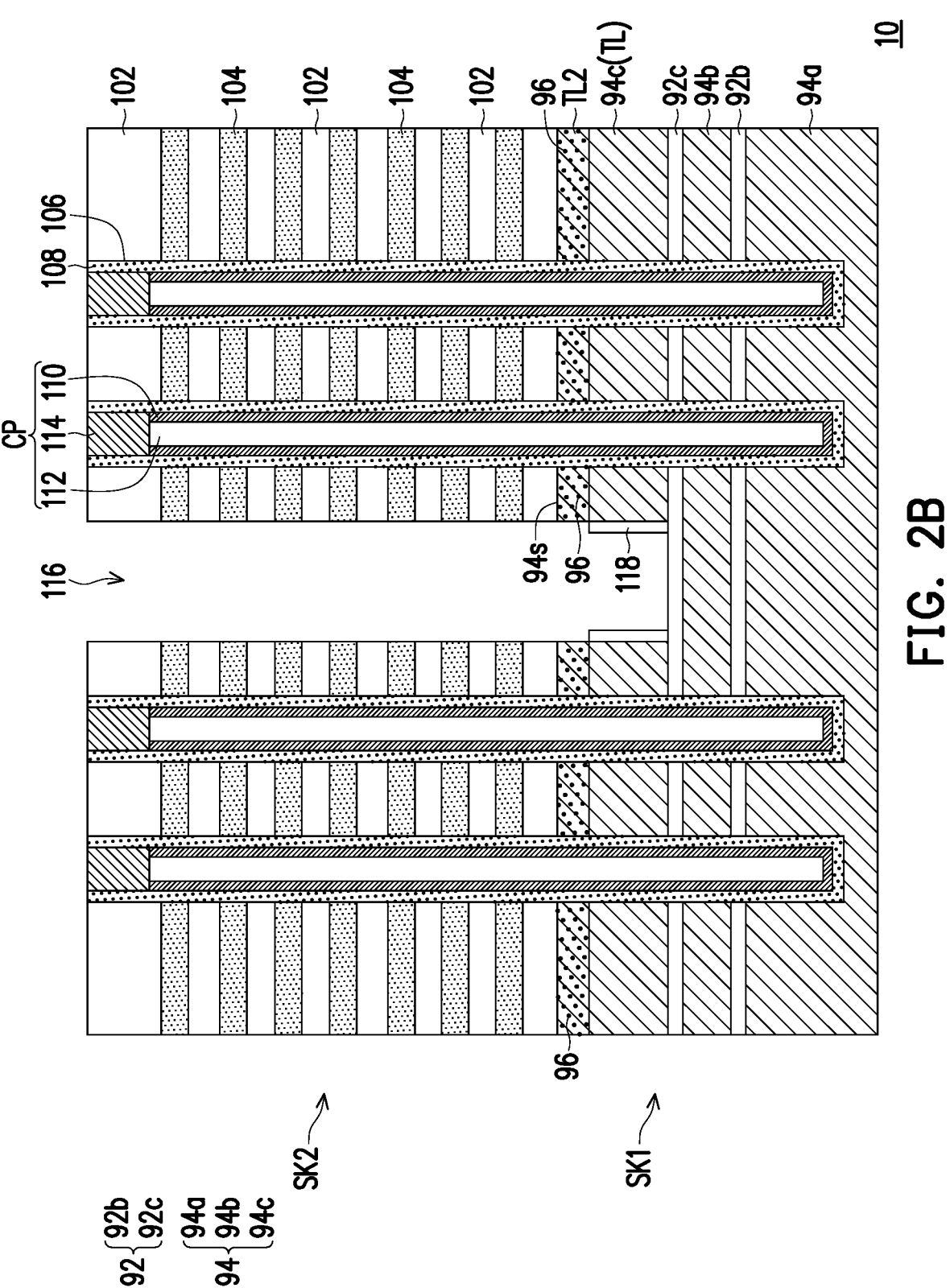

Referring to FIG. 2B, a stack structure SK2, a trench 116 and a protective layer 118 are formed as described above. Similarly, during the thermal oxidation process of forming the protective layer 118, the top layer TL2 may prevent or reduce the oxidation of the surface 94s of the conductive layer 94c, and thus prevent or reduce the conductive layer 94c from pressing the stack structure SK2 upward. Accordingly, the bottommost one or ones of the middle layers 104 are prevented from being squeezed and deformed.

Figure 2C:
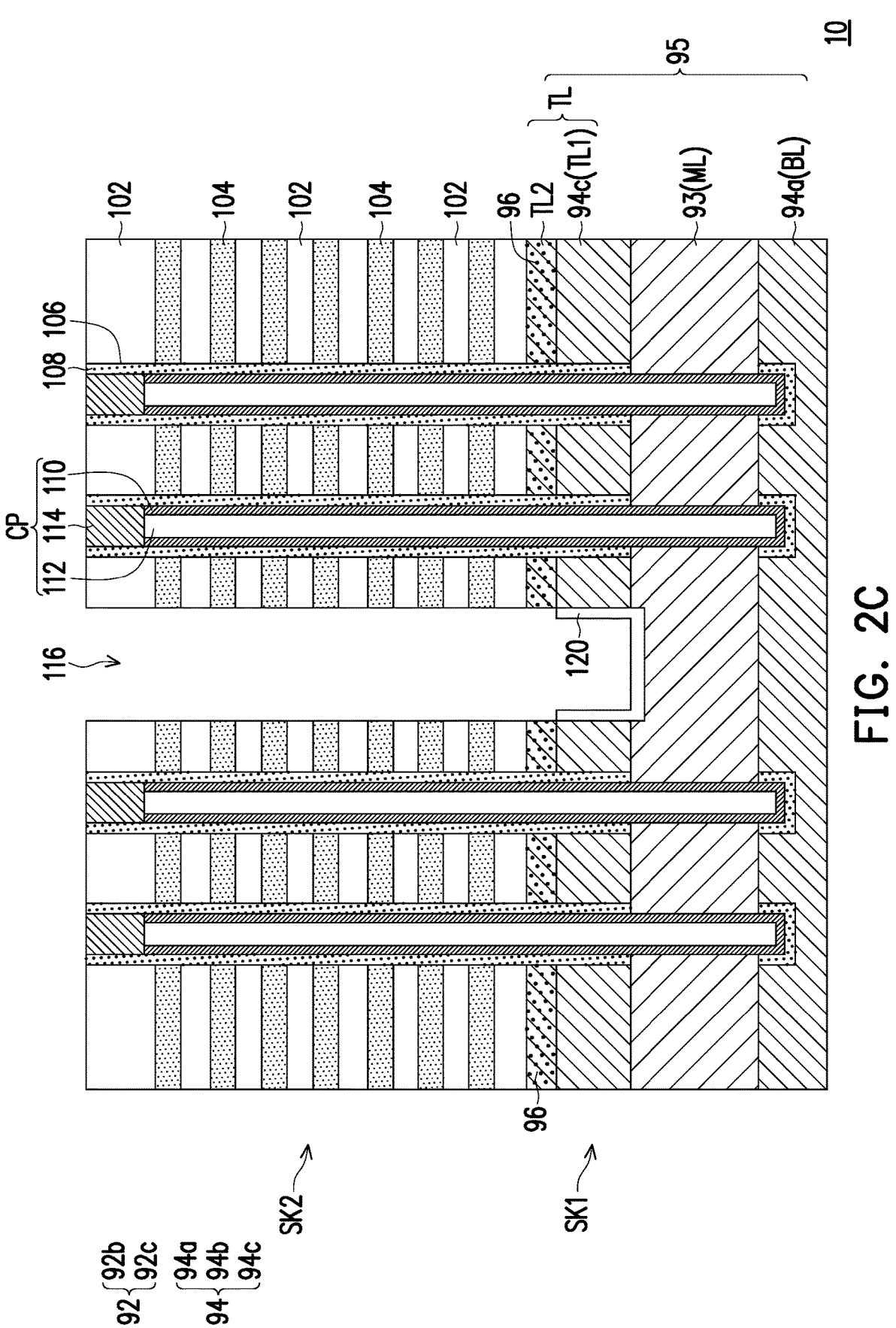

Referring to FIG. 2C, the conductive layer 93 and the protective layer 120 are formed as described above. Similarly, in the thermal oxidation process of forming the protective layer 120, the top layer TL2 may prevent or reduce the oxidation of the surface 94s of the conductive layer 94c, and thus prevent or reduce the conductive layer 94c from pressing the stack structure SK2 upward. Accordingly, the bottommost one or ones of the middle layers 104 are prevented from being squeezed and deformed.

Figure 2D:
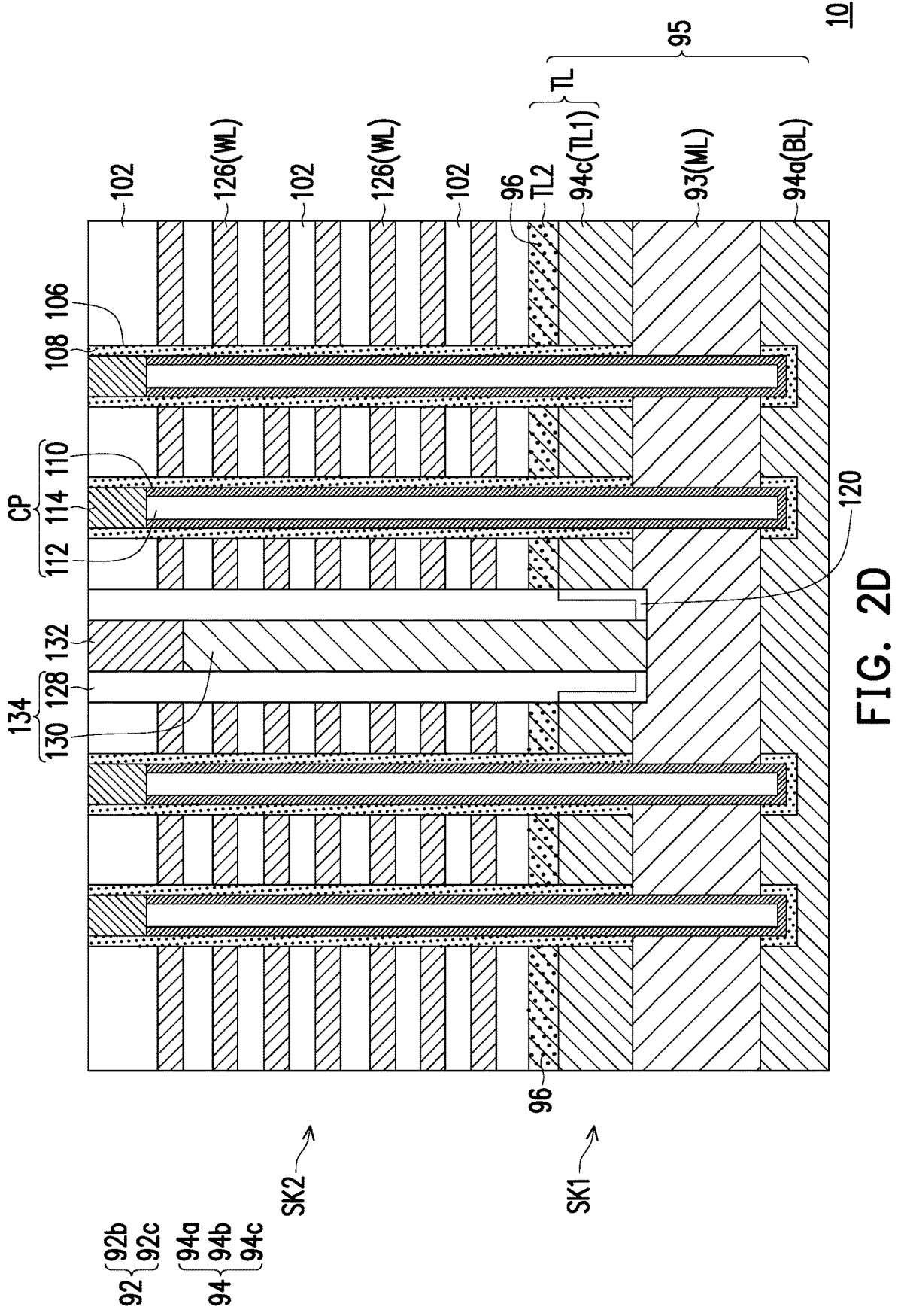

Referring to FIG. 2D, the conductive layer 126 and the slit SLT are formed according to the above method.

In some embodiment, the stop structure 95 includes a bottom layer BL, a middle layer ML and a top layer TL. The middle layer ML is disposed below the top layer TL and the slit SLT, and is electrically connected to the conductive layer 130 of the slit SLT. The bottom layer BL is disposed below the middle layer ML. The bottom layer BL and the middle layer ML are respectively the conductive layers 94a, 93. The top layer TL includes the top layers TL1 and TL2. The top layer TL1 is the conductive layer 94c. The top layer TL2 is a silicon nitride layer. The top layer TL2 has a thickness in a range from 20 angstroms to 100 angstroms. The conductive layers 94a, 93, 94c may be semiconductor layers, such as polysilicon layers or doped polysilicon layers. The top layer TL2 is, for example, silicon nitride. The anti-oxidation atoms 96 may include nitrogen atoms. The top layer TL2 is higher than the bottom surface of the slit SLT. The top layer TL2 is disposed in the top portion of the conductive layer (e.g., semiconductor layer) 94c. In other words, the concentration of the nitrogen atoms in the top layer TL2 is higher than that in the conductive layers 94c, 93, 94a. The conductive layers 94c, 93, 94a do not have the anti-oxidation atoms 96.

In the embodiment of the disclosure, the formation of the anti-oxidation atoms may reduce or prevent the top conductive layer of the first stack structure from being oxidized and pressing the underlying middle layers, so that the middle layer may maintain enough width. Thus, during the gate replacement process, the gate conductive layer may successfully fill into the horizontal trench (formed after removing the middle layer). Therefore, gaps in the formed gate conductive layer may be prevented or reduced.

What is claimed is:

1. A method of fabricating a memory device, comprising:
forming a first stack structure above a substrate, wherein the first stack structure comprises a plurality of first insulating layers and a plurality of first conductive layers alternately stacked, and a top layer of the first stack structure includes a plurality of anti-oxidation atoms therein, the top layer is a portion of a top first conductive layer of the plurality of first conductive layers, and the plurality of anti-oxidation atoms are formed by performing a surface treatment process on the top first conductive layer;
forming a second stack structure on the first stack structure, wherein the second stack structure comprises a plurality of second insulating layers and a plurality of middle layers alternately stacked;
forming a slit trench, the slit trench extending from the second stack structure to the top first conductive layer; and
forming a protective layer on a sidewall of the top first conductive layer exposed by the slit trench.

2. The method of claim 1, wherein the plurality of anti-oxidation atoms comprises nitrogen atoms.

3. The method of claim 1, wherein the surface treatment process comprises a plasma treatment process.

4. The method of claim 3, wherein a gas used in the plasma treatment process comprises ammonia, nitrogen or a combination thereof.

5. The method of claim 1, wherein forming the protective layer comprises performing a thermal oxidation process on the sidewall of the top first conductive layer exposed by the slit trench.

6. The method of claim 1, further comprising:
replacing a portion of the plurality of first insulating layers and a middle conductive layer of the plurality of first conductive layers with a second conductive layer; and
replacing the plurality of middle layers with a plurality of third conductive layers.

7. A memory device, comprising:
a stop structure above a substrate;
a stack structure on the stop structure, wherein the stack structure comprises a plurality of insulating layers and a plurality of conductive layers alternately stacked; and a slit, extending through the stack structure and a portion of the stop structure,
wherein the stop structure comprises a top layer, the top layer includes a plurality of anti-oxidation atoms therein, the top layer comprises a first semiconductor layer, and the plurality of anti-oxidation atoms are distributed in a top portion of the first semiconductor layer.

8. The memory device of claim 7, wherein the slit comprises a protective layer and a filling layer, and the protective layer is disposed between the stop structure and the filling layer.

9. The memory device of claim 8, wherein the plurality of anti-oxidation atoms are different from constituent elements of the protective layer.

10. The memory device of claim 7, wherein the plurality of anti-oxidation atoms comprise nitrogen atoms, and the protective layer comprises silicon oxide.

11. The memory device of claim 10, wherein a concentration of the nitrogen atoms ranges from 15 atomic % to 25 atomic %.

12. The memory device of claim 7, wherein a distribution range of the plurality of anti-oxidation atoms in the top portion of the first semiconductor layer is higher than a distribution range of the plurality of anti-oxidation atoms at a bottom surface of the slit.

13. The memory device of claim 1, wherein the stop structure comprises a middle layer disposed below the top layer and the slit, and the middle layer comprises a second semiconductor layer electrically connected to the slit.

14. The memory device of claim 13, wherein a sidewall of the first semiconductor layer and a top surface of the second semiconductor layer are covered by the protective layer.

15. The memory device of claim 14, wherein a concentration of the plurality of anti-oxidation atoms in the first semiconductor layer is larger than a concentration of the plurality of anti-oxidation atoms in the second semiconductor layer.

16. The memory device of claim 14, wherein the stop structure comprises a bottom layer below the middle layer, the bottom layer comprises a third semiconductor layer, and the third semiconductor layer does not have the plurality of anti-oxidation atoms.

17. The memory device of claim 7, wherein the top layer comprises silicon nitride.

* * * * *